US010043126B2

(12) United States Patent
Pachler et al.

(10) Patent No.: US 10,043,126 B2
(45) Date of Patent: Aug. 7, 2018

(54) CHIP CARD MODULE, CHIP CARD AND METHOD OF FORMING A CHIP CARD MODULE

(71) Applicant: Infineon Technologies AG, Neubiberg (DE)

(72) Inventors: Walther Pachler, Graz (AT); Stephan Rampetzreiter, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/477,128

(22) Filed: Apr. 3, 2017

(65) Prior Publication Data
US 2017/0316303 A1 Nov. 2, 2017

(30) Foreign Application Priority Data

Apr. 29, 2016 (DE) ........................ 10 2016 107 982

(51) Int. Cl.
*G06K 19/06* (2006.01)
*G06K 19/077* (2006.01)
*H01L 23/66* (2006.01)
*H01L 23/00* (2006.01)
*H01L 25/04* (2014.01)
*H01L 49/02* (2006.01)

(52) U.S. Cl.
CPC . *G06K 19/07775* (2013.01); *G06K 19/07722* (2013.01); *G06K 19/07743* (2013.01); *H01L 23/66* (2013.01); *H01L 24/03* (2013.01); *H01L 24/06* (2013.01); *H01L 25/04* (2013.01); *H01L 28/60* (2013.01); *H01L 2223/6677* (2013.01)

(58) Field of Classification Search
CPC ....... G06K 19/07775; G06K 19/07777; G06K 19/07743; H01L 28/60; H01L 28/78; H01L 2223/6677
USPC .................................................. 235/487, 492
See application file for complete search history.

(56) References Cited

U.S. PATENT DOCUMENTS

| 2012/0074233 A1* | 3/2012 | Finn ...................... G06K 19/077 235/492 |
| 2014/0246503 A1* | 9/2014 | Hofer ............... G06K 19/07794 235/492 |
| 2015/0097040 A1* | 4/2015 | Rampetzreiter . G06K 19/07779 235/492 |
| 2015/0278675 A1* | 10/2015 | Finn ..................... B23K 26/361 235/492 |

* cited by examiner

Primary Examiner — Paultep Savusdiphol
(74) Attorney, Agent, or Firm — Viering, Jentschura & Partner mbB

(57) ABSTRACT

In various embodiments, a chip card module for a chip card is provided. The chip card module may include a carrier with a first side and an opposite second side, a chip arranged over the first side of the carrier, an antenna arranged over the carrier. The antenna may be electrically conductively coupled to the chip and configured to inductively couple to a second antenna formed on a chip card body of the chip card. The chip card module may further include a capacitor electrically conductively coupled to the chip, the capacitor including a first electrode arranged over the first side of the carrier, and a second electrode arranged over the second side of the carrier.

17 Claims, 7 Drawing Sheets

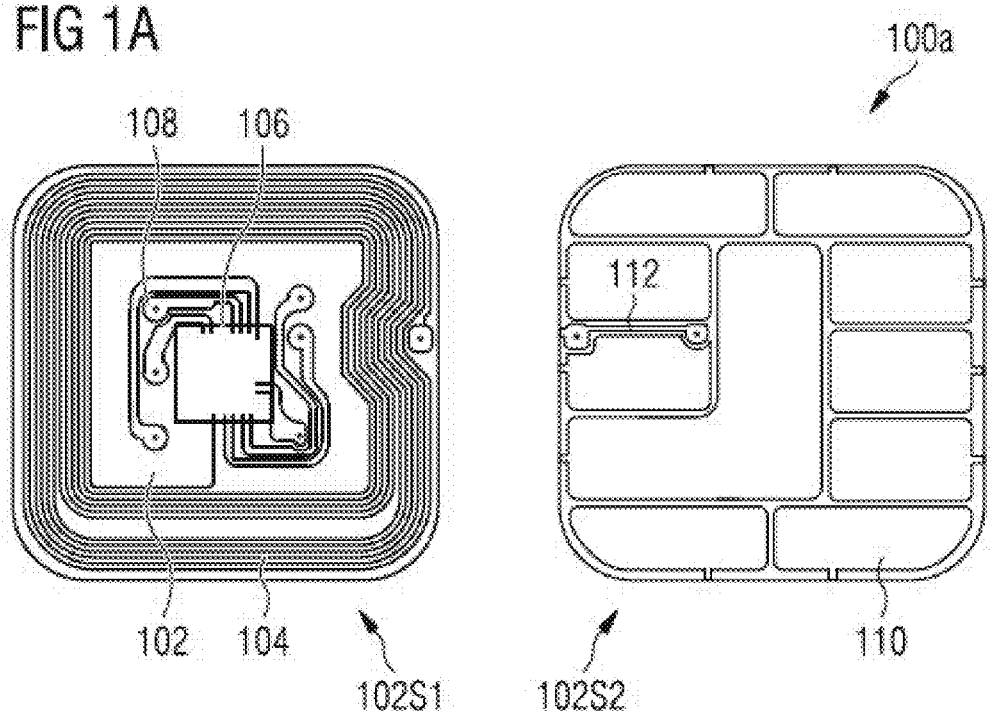
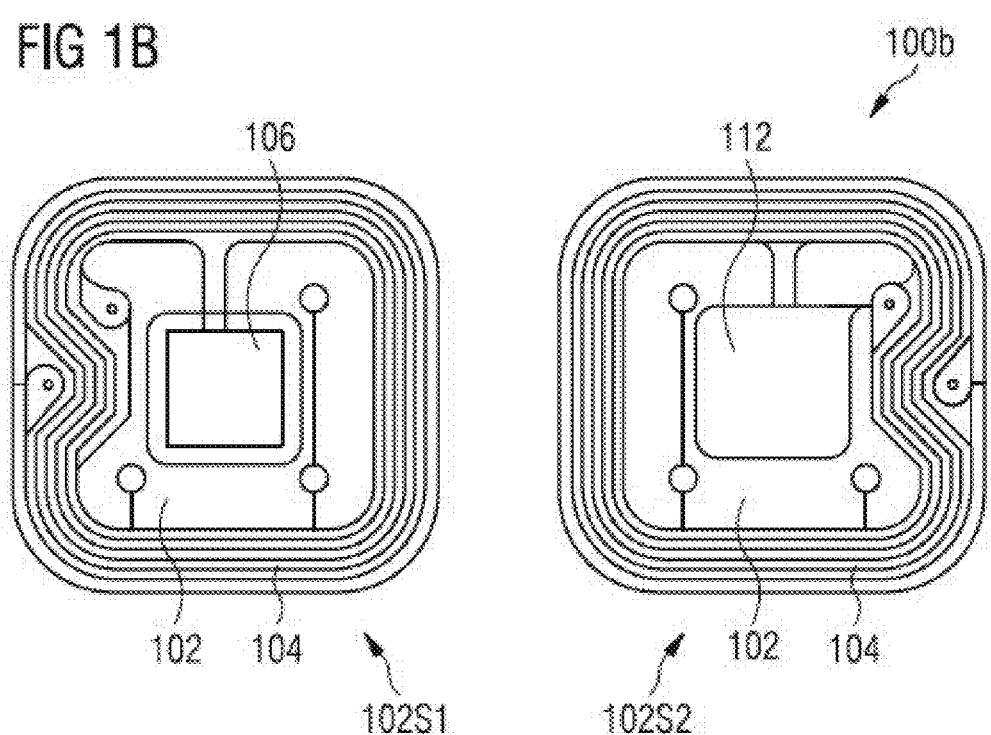

FIG. 2A
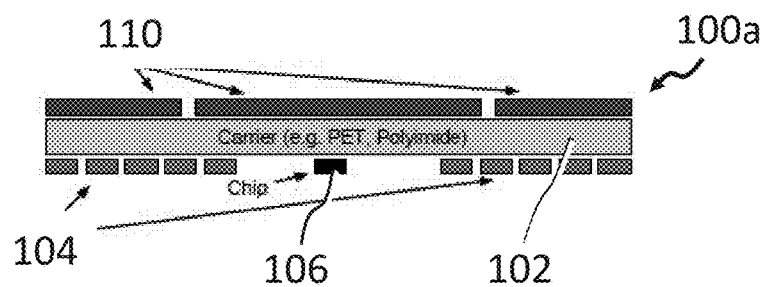
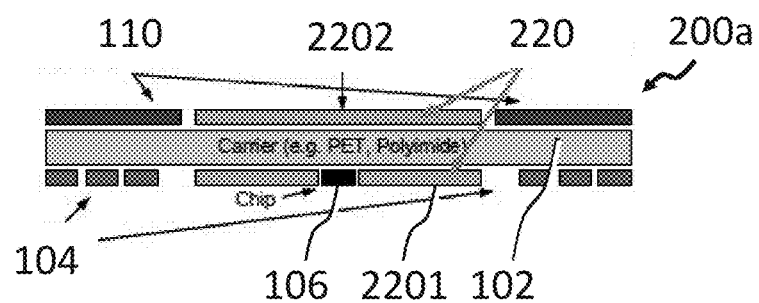
FIG. 2B
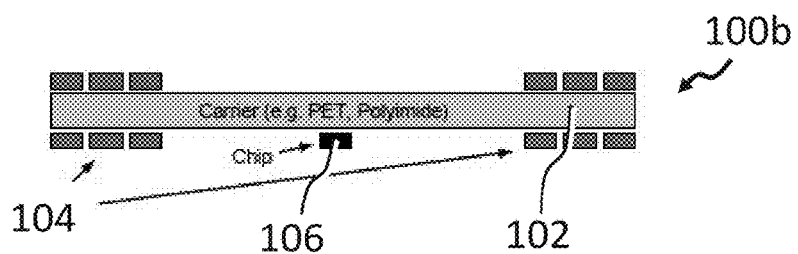
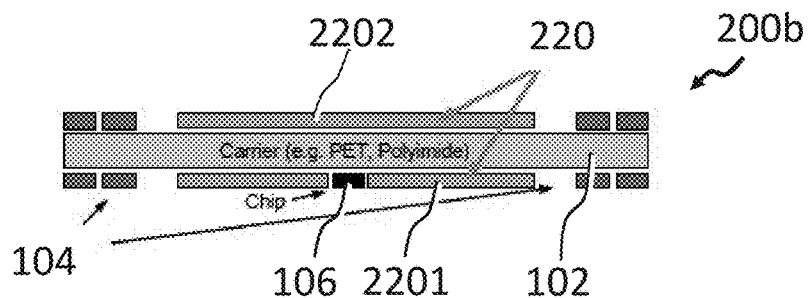

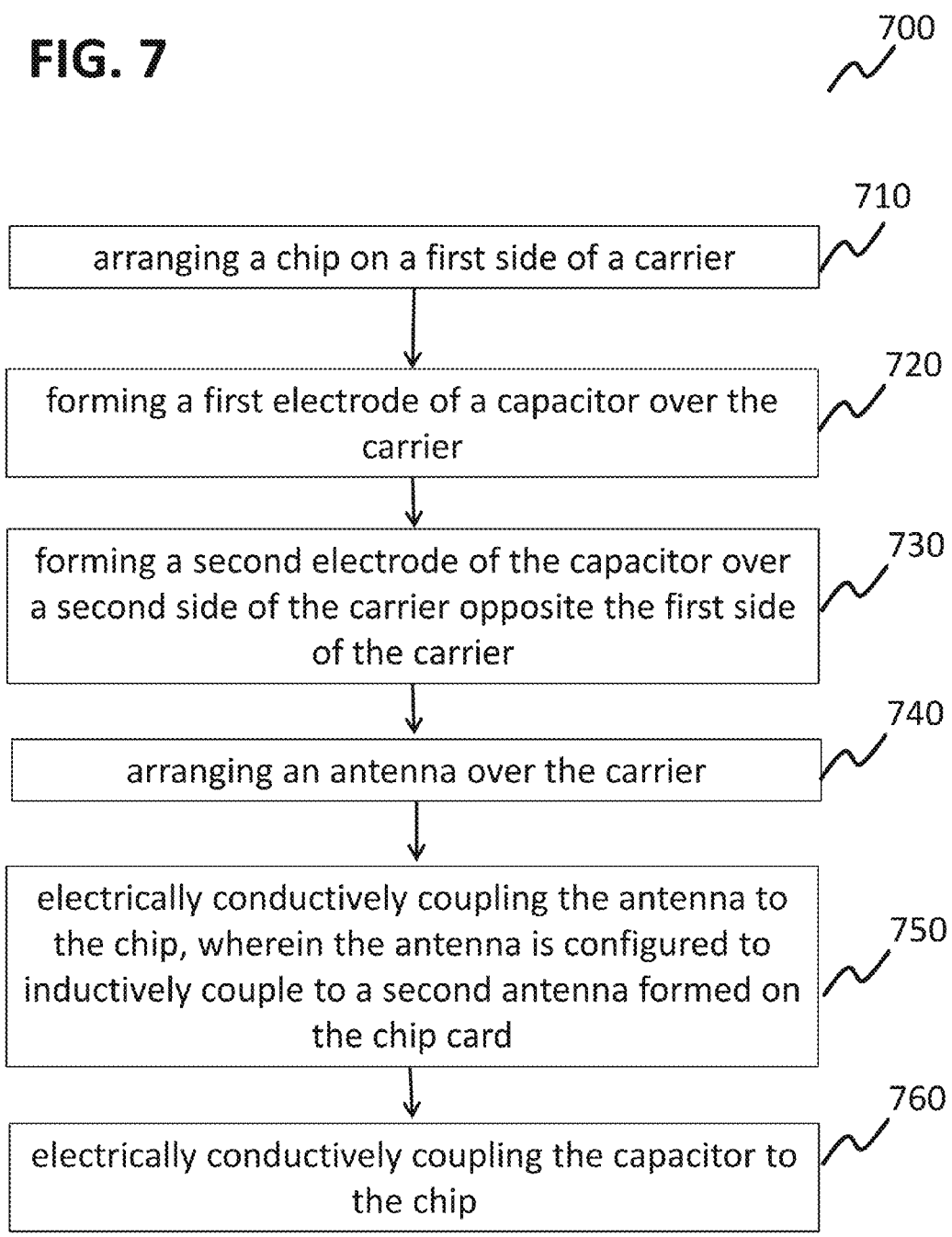

CHIP CARD MODULE, CHIP CARD AND METHOD OF FORMING A CHIP CARD MODULE

CROSS-REFERENCE TO RELATED APPLICATION

This application claims priority to German Patent Application Serial No. 10 2016 107 982.0, which was filed Apr. 29, 2016, and is incorporated herein by reference in its entirety.

TECHNICAL FIELD

Various embodiments relate generally to a chip card module and to a method of forming a chip card module.

BACKGROUND

Chip cards (also referred to as smart cards) may include an integrated chip card module (also referred to as chip module or smart card module) having at least one chip. The chip card module may be arranged in a chip card body.

A chip card can be a so-called "dual interface" chip card (DIF chip card), i.e. the chip card may include both a chip contact structure, e.g. chip contact pads, arranged on the chip card module, for example, for electrically connecting the chip card to a device, for example to a card reader, and an apparatus for wireless communication, which may use induction for data interchange and energy supply of the chip card, for example by the use of radio waves. The apparatus for wireless communication chip also be referred to as an interface for wireless data transmission, a wireless interface, or a CL interface.

The wireless interface may include, for example, an antenna arranged in the chip card body. Said antenna may also be referred to as chip card body antenna or booster antenna. The booster antenna may be designed in such a way that contactless data transfer between the booster antenna and an external device may take place. In other words, the booster antenna may be designed in such a way that it can receive and transmit electromagnetic information and energy from and to outside the chip card. In addition, the wireless interface may include an antenna in the chip card module. The booster antenna may be inductively coupled to the antenna of the chip card module or may couple inductively. In other words, the antenna of the chip card module may be designed in such a way that it can perform information and energy interchange by induction with the booster antenna. The antenna of the chip card module may additionally be electrically conductively connected to the chip.

Therefore, contactless data transfer may be enabled between the external device and the chip (from the external device to the chip and/or from the chip to the external device) by the booster antenna, the antenna in the chip card module, and the electrically conductive connection to the chip.

The technology of the antenna arranged on the chip card module for inductive coupling to the booster antenna is also referred to as coil-on-module (CoM).

In CoM-modules, the antenna may be designed to match an input capacitance of the chip.

For example, in combination with the booster antenna, the CoM module may be used for realizing a reliable dual interface (DIF) chip card.

In case of an application requiring contactless communication only, a module may be equipped with coil windings on both sides. Up to now, only coil structures may be used.

SUMMARY

In various embodiments, a chip card module for a chip card is provided. The chip card module may include a carrier with a first side and an opposite second side, a chip arranged over the first side of the carrier, an antenna arranged over the carrier. The antenna may be electrically conductively coupled to the chip and configured to inductively couple to a second antenna formed on a chip card body of the chip card. The chip card module may further include a capacitor electrically conductively coupled to the chip, the capacitor including a first electrode arranged over the first side of the carrier, and a second electrode arranged over the second side of the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a DIF chip card module, and FIG. 1B shows a contactless only (CL only) chip card module;

FIGS. 2A and 2B each show cross sectional views of a CoM chip card module according to various embodiments in comparison to a conventional CoM chip card module;

FIG. 7 shows a process flow of a method of forming a chip card module in accordance with various embodiments.

DESCRIPTION

Figure 3A:
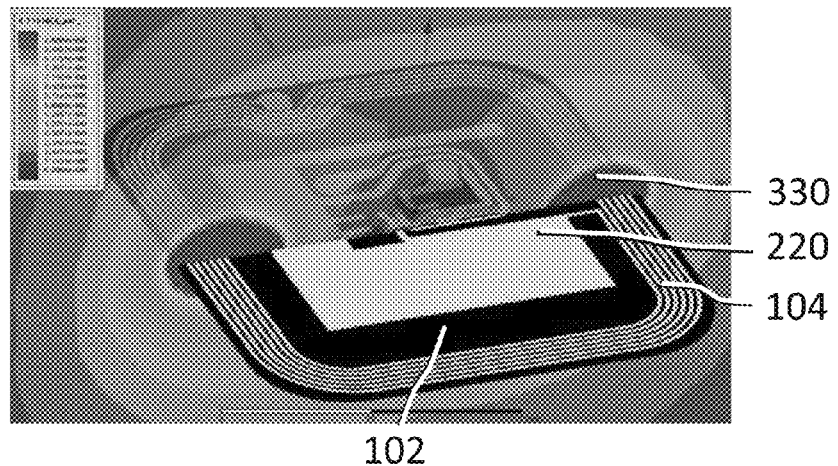
FIG. 3A and FIG. 3B each show a simulation of a magnetic field of a CoM module in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

For this application, the a design of the module may be similar to a design of a common ISO 7816 module.

Such a common module may be dual interface (DIF) module type. A DIF module 100*a* is shown in FIG. 1A. In compliance with ISO 7186, the DIF module may have dimensions of 11.8 mm by 13.0 mm (i.e. an area of about 149 mm²).

An antenna 104 (also referred to as a coil 104) intended for contactless communication may be arranged on a bottom side, also referred to as the first side 102S1, of a carrier 102. A chip 106 and chip contact structures 108 may also be arranged on the first side 102S1 of the carrier 102.

Chip contact pads 110 (also referred to as ISO pads 110 or contact pads 110) may be arranged on a top side, also referred to as the second side 102S2. A simple bridge 116 on the top side 102S2 may be used for closing the coil 104.

FIG. 1B shows a common contactless module (CL module) 100*b*. It may have dimensions of 8.0 mm by 8.0 mm (i.e. an area of about 60 mm2). It may have a chip 106 arranged on a first side 102S1 of a carrier 102. An antenna 104 (a coil 104) intended for contactless communication may be arranged on the first side 102S1 and on the second side 102S2 of the carrier 102, as shown in FIG. 1B. The second side 102S2 of the CL module may be free from contact pads. However, a metal plate 112 may be arranged on the second side 102S2, for example for increasing a heat dissipation.

Due to a number of windings of the coil 104 that may be needed for realizing a required inductance value, a space to realize additional structures may be limited. However, realizing structures forming an additional capacitor connectable in parallel to an input of the chip would allow reducing the number of windings of the coil 104. Moreover, a suitably high capacitance value would be beneficial in terms of power matching. Thus, an overall performance of such structures could be improved significantly.

In various embodiments, a chip card module, e.g. a CoM, is provided. A CoM module may be improved by introducing an additional capacitor structure. The chip card module may have a design that includes a plate capacitor connected in parallel to the input pads of a chip.

In various embodiments, the capacitor may be formed as an integrated part of the chip card module, which may e.g. be based on a double-sided coated carrier. In that respect, the capacitor may be similar to the coil. The carrier may for example include or consist of PET, polyimide or any other dielectric material.

In various embodiments, due to the additional capacitor, the inductance of the coil and thus its number of turns may be reduced. Consequently, additional space may be created.

Simulations have shown that the chip card module, a chip card and a method of forming a chip card in accordance with various embodiments may improve an overall performance of a CoM system significantly.

In current CoM chip card modules, metal structures may be implemented for heat distribution (e.g. in CL-only CoM modules) and for forming ISO pads (e.g. in DIF CoM modules).

In various embodiments, plates (e.g. metal plates) of an additional capacitor may be introduced. Thus, the additional capacitor may be a plate capacitor.

A value of the additionally generated capacitance may be calculated by:

$$C = \frac{\varepsilon A}{d}$$

Where,
C=Capacitance in Farads
ε=Permittivity of dielectric (absolute, not relative)
A=Area of plate overlap in square meters
d=Distance between plates in meters FIG. 2A shows, in its bottom panel, a cross-sectional view of a CoM chip card module 200*a* according to various embodiments. For comparison, a cross sectional view of a conventional CoM chip card module 100*a* is shown in the top panel. The chip card module of FIG. 2A may be a dual interface module (DIF module).

FIG. 2B shows, in its bottom panel, a cross-sectional view of a CoM chip card module 200*b* according to various embodiments. For comparison, a cross sectional view of a conventional CoM chip card module 100*b* is shown in the top panel. The chip card module of FIG. 2B may be a contactless only (CL only) chip card module.

In various embodiments, the chip card module 200*a*, 200*b* may include a carrier 102.

The carrier 102 may have a first side 102S1 with a first main surface and a second side 102S2 with a second main surface 102S2, wherein the first side 102S1 is opposite the second side 102S2, and consequently the second main surface is opposite the first main surface.

In various embodiments, the chip card module 200*a*, 200*b* may include a chip 106. The chip 106 may be arranged over the first side 102S1 of the carrier 102. The chip 106 may include at least one metallization layer and at least one chip contact (neither illustrated).

In various embodiments, the chip 106 may include at least one integrated circuit, an electronic circuit, a memory chip or an RFID chip (a chip for identification by electromagnetic waves, namely "radiofrequency identification") or any other desired type of chip.

In various embodiments, the chip card module 200*a*, 200*b* may include a capacitor 220 electrically conductively coupled to the chip 106.

In various embodiments, the capacitor may include a first electrode 2201 and a second electrode 2202 arranged at a distance d, wherein the first electrode 2201 may be arranged over the first side 102S1 of the carrier 102, and the second electrode 2202 arranged over the second side of 102S2 of the carrier 102. The first electrode 2201 may for example be formed on the first surface 102S1 of the carrier 102. The second electrode 2202 may for example be formed on the second surface 102S2 of the carrier 102. The distance d may correspond to a thickness of the carrier 102, e.g. to a thickness of the carrier 102 at a region where the first electrode 2201 and the second electrode 2202 are formed.

In various embodiments, the first electrode 2201 and the second electrode 2202 may include or consist of an electrically conductive material. The electrically conductive material may for example be a metal, for example copper (with an electrical conductivity of about $58.1 \times 10^6$ S/m) or a copper alloy, or may essentially consist of metal. It may for example include at least one metal of Cu, Al, Au, Ag, Pt, Ti, Ni, Sn, Zn and Pb. The first electrode 2201 and the second electrode 2202 may have the same material(s) or (a) different material(s).

In various embodiments, the first electrode 2201 and/or the second electrode 2202 may have a thickness in a range of from approximately 5 µm to approximately 100 µm, for example from approximately 10 µm to approximately 50 µm, for example from approximately 12 µm to approximately 30 µm. The first electrode 2201 and the second electrode 2202 may have the same thickness(es) or (a) different thickness(es).

The carrier 102 may include a dielectric material or substantially consist of such a material. The dielectric material may, for example, include or consist of a plastic material, for example a polymer. The polymer may be, for example, a polyester, for example PET or polyethylene naphthalate (PEN), or a polyimide (PI). Alternatively, the carrier 102 may include a different dielectric material.

A thickness of the carrier 102 may be in a range from about 10 µm to about 100 µm, for example in a range from about 20 µm to about 80 µm, for example about 25 µm or about 75 µm.

Current CoM modules typically use one of two different types of layer structures: A layer structure including PI or a layer structure including PET.

Figure 4:
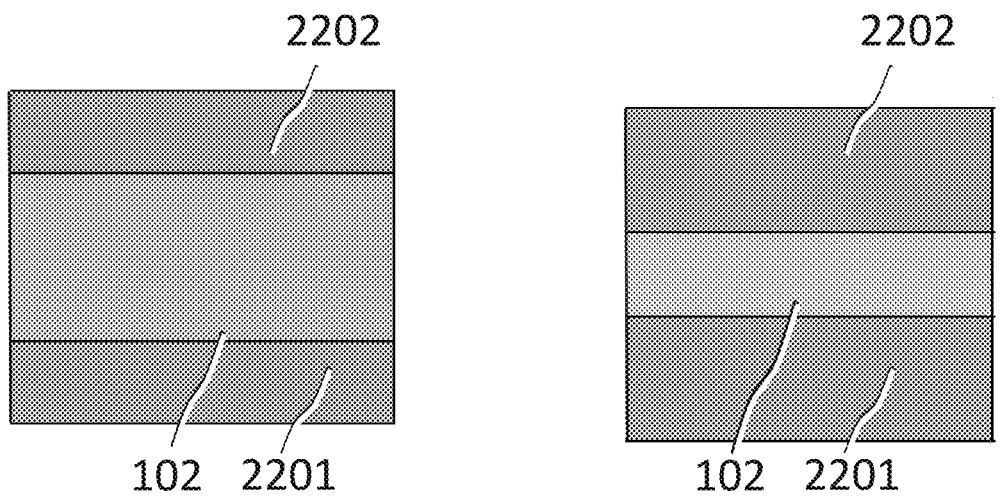
FIG. 4 shows two types of layer structures of chip card modules according to various embodiments.

FIG. 4 shows, as details of the regions A in FIG. 2A and FIG. 2B, two exemplary types of layer structures of chip card modules in accordance with various embodiments. In the left panel, a chip card module 200a, 200b with a carrier 102 including or consisting of PET is shown, and in the right panel, a chip card module 200a, 200b with a carrier 102 including or consisting of PI is shown.

In various embodiments, the carrier 102 including or consisting of PET may have a thickness in a range from about 65 µm to about 85 µm.

In various embodiments, the carrier 102 including or consisting of PI may have a thickness in a range from about 10 µm to about 30 µm.

The carrier 102 including or consisting of PI may thus be thinner than the carrier 102 including or consisting of PET. Thus, in a chip card module 200a, 200b including or consisting of PI, the first electrode 2201 and the second electrode 2202 may have a smaller distance d than in a chip card module 200a, 200b including or consisting of PET. Thereby, a higher capacitance may be reached in the capacitor 220 of the chip card module 200a, 200b including or consisting of PI.

Furthermore, PI may have a higher permittivity than PET (relative permittivity of polyimide: $\varepsilon_r$=3.4, relative permittivity of PET: $\varepsilon_r$=3.0). Thus, a higher capacitance may be reached in the capacitor 220 of the chip card module 200a, 200b including or consisting of PI. PET may have a phase shift tan $\varphi$=0.016 at 1 MHz, polyimide may have a phase shift tan $\varphi$=0.018 at 1 MHz. In various embodiments, dielectric materials having an even higher permittivity than polyimide may be used for the carrier 102.

In various embodiments, the chip card module 200a, 200b may include an antenna 104. The antenna 104 may be arranged over the first side 102S1 of the carrier 102, for example on the first main surface of the carrier 102. The antenna 104 may be arranged in a plane that is essentially parallel to the first main surface. The antenna 104 may include an electrically conductive material. It may for example include or essentially consist of at least one of the following materials: a metal, a metallic material, an alloy, an intermetallic compound, copper, aluminum, titanium, titanium nitride, tungsten, gold, silver, nickel, zinc, an aluminum-silicon alloy.

The antenna 104 may in various embodiments be formed by forming a layer on or over the carrier 102 and etching the layer, for example by copper etching technology or by aluminum etching technology.

In various embodiments, the antenna 104 may include or essentially consist of an individual conductive line. The antenna 104 may be arranged in the plane in such a way that it is formed around a region, for example around a rectangular or square region. In various embodiments, the antenna 104, as illustrated in FIG. 3, may be formed as a flat spiral around the rectangular or square region.

In various embodiments, for example (but not only) in case of the chip card module being the CL chip card module 200b, the antenna 104 may additionally or exclusively be formed over the second side 102S2 of the carrier 102. In that case, an electrically conductive connection between a first-side-portion of the antenna 104 located on the first side of the carrier 102 and a second-side-portion of the antenna 104 located on the second side of the carrier 102, and/or an electrically conductive connection between the chip 106 and the second-side-portion of the antenna 104 may be provided by at least one first plated through hole (not shown) formed in the carrier 102.

A plated-through hole is understood to mean an opening which is formed through a material, for example by punching, etching, laser drilling or drilling, and which is designed in such a way that electric current can be conducted through said plated-through hole, for example by an electrically conductive coating, for example along an inner surface of the opening, or by a conductor, for example a wire or a pin which is introduced into the opening.

In various embodiments, in a case of the antenna 104 or the first-side portion of the antenna 104 being arranged on the first side 102S1 of the carrier 102, the first electrode 2201 may be located laterally between the chip 106 and the antenna 104. The first electrode 2201 may partially or completely surround the chip 106.

In various embodiments, the first electrode 2201 may be arranged in a plane formed by the antenna 104 or the first-side portion of the antenna 104.

An active area of the capacitor 220 may be defined by a region in which the first electrode 2201 and the second electrode 2202 vertically overlap. The first electrode 2201 and the second electrode 2202 may thus, in various embodiments, be arranged to maximize their overlap region. In various embodiments, the second electrode 2202 may be essentially opposite the first electrode 2201.

In various embodiments, the first electrode 2201 and/or the second electrode 2201 may be essentially rectangular, essentially ellipsoidal, essentially circular, essentially polygonal, or of any other shape. The first electrode 2201 may, in various embodiments, have an opening into which the chip may be inserted. In various embodiments, the first electrode 2201 may have an opening in which a chip contact structure 108 (see FIG. 3) may be formed.

In various embodiments, the first electrode 2201 and the second electrode 2202 may be essentially congruent. In various embodiments, their shapes may differ.

In various embodiments, the chip card module 200a may further include a plurality of chip contact pads 110 arranged over the second side 102S2. The chip contact pads 110 may provide an electrically conductive contact to the chip 106 from an outside of the chip card module 200a (and/or from an outside of a chip card in/on which the chip chard module 200a may be integrated or arranged).

In various embodiments, an electrically conductive contact between the chip 106 and the plurality of chip contact pads 110 may be provided by a plurality of second plated through holes (not shown).

The plurality of chip contact pads 110 may be formed by a metal layer, for example a copper layer or a copper alloy layer, or may essentially consist of metal. The chip contact pads 110 may for example include at least one metal of Cu, Al, Au, Ag, Pt, Ti, Ni, Sn, Zn and Pb.

The plurality of chip contact pads 110 may have a thickness in a range of from approximately 5 µm to approximately 100 µm, for example from approximately 10 µm to approximately 50 µm, for example from approximately 12 µm to approximately 30 µm.

In various embodiments, the plurality of chip contact pads 110 may have been laminated onto the second main surface of the carrier 102, for example by an adhering agent, for example an adhesive.

The plurality of chip contact pads 110 may, in various embodiments, be structured. During structuring of the plurality of chip contact pads 110, in addition the dielectric layer 109 may be structured. The structuring of the chip contact pads 110 may be performed by lithographic and etching methods. For example, nonconductive structures, for example in the form of openings, furrows, etc., may be arranged between individual contact pads of the plurality of chip contact pads 110.

In various embodiments, other methods known in the art may be used for forming and/or for structuring the chip contact pads 110.

The chip contact pads 110 may, in various embodiments, at least partially laterally surround the second electrode 2202.

In various embodiments, the second electrode 2202 may be formed together with the plurality of chip contact pads 110.

In various embodiments, a structure of the plurality of chip contact pads 110 may be modified, and a portion of an electrically conductive layer typically serving as the chip contact pads 110 may thus be used as the second electrode 2202 of the capacitor 220.

Figure 5:
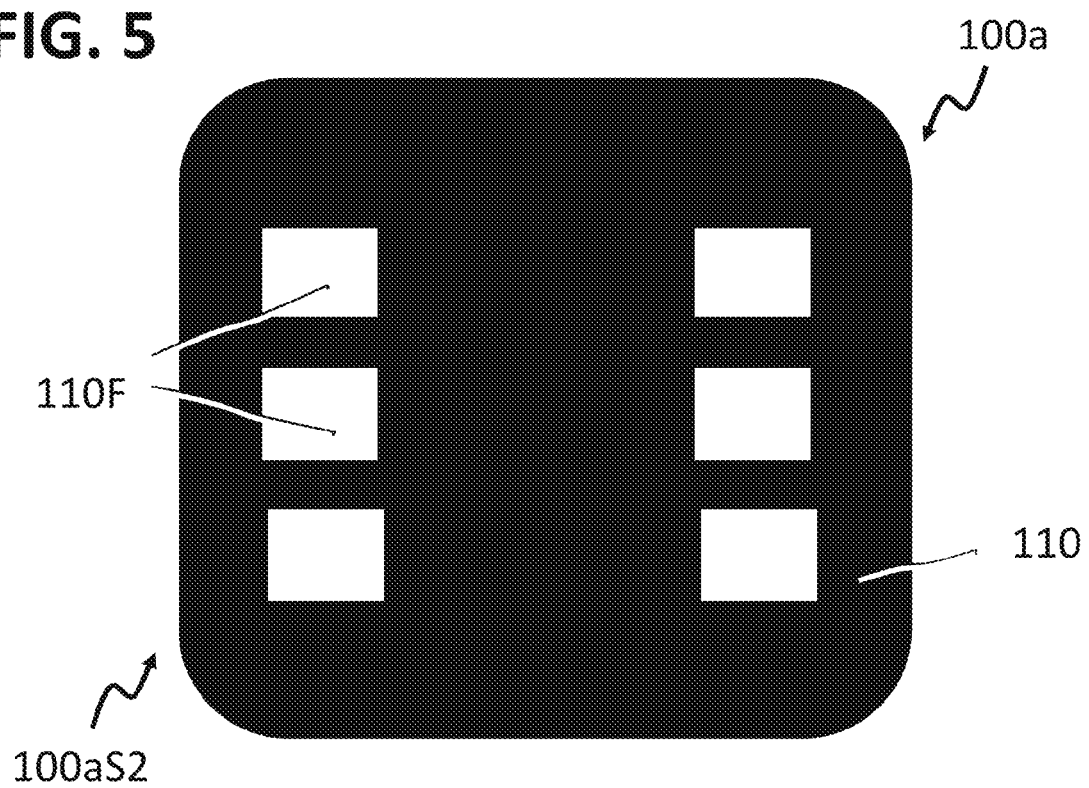
FIG. 5 shows a schematic view of a DIF chip card module.
Figure 6:
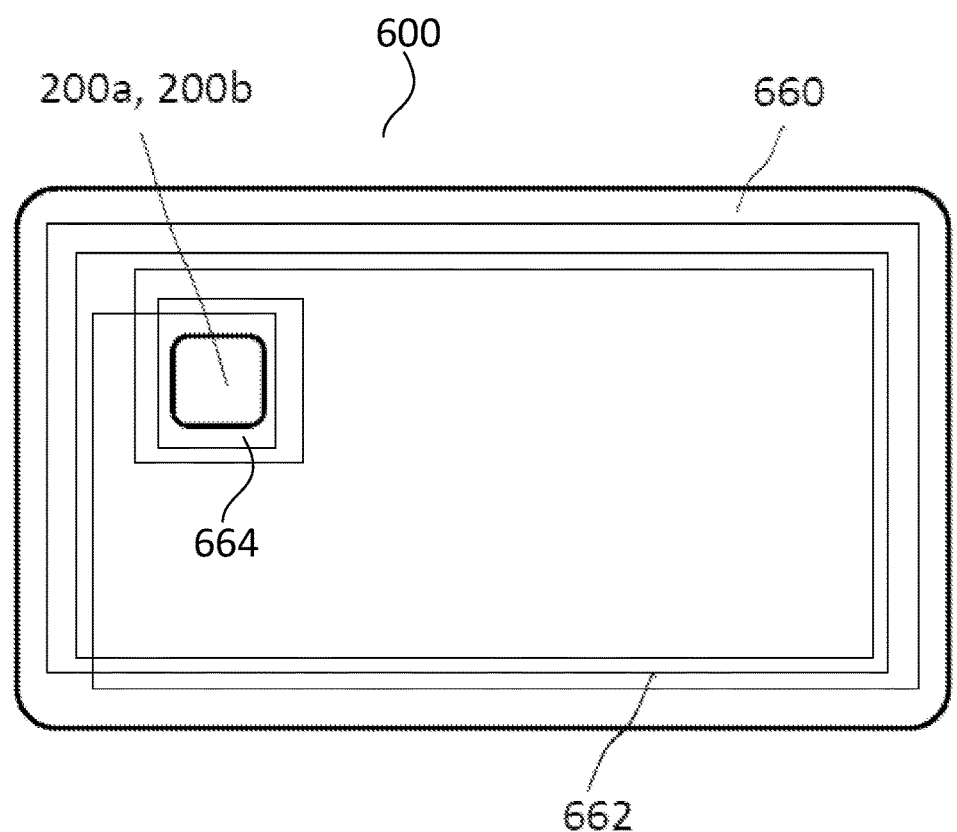
FIG. 6 shows a chip card in accordance with various embodiments.

FIG. 5 shows a schematic view of a DIF chip card module 100*a*. Light regions marked with 110F are regions that are reserved (according to ISO 7816) for being used as contacts. The black regions may in various embodiments be modified for serving as the second electrode 2202 of the capacitor 220.

In various embodiments, the capacitor 220 may be electrically coupled to the chip 106. The capacitor 220 may for example be electrically coupled to the chip 106 in parallel to the chip contact pads 110. Thus, a capacitance of an inductive coupling system formed by the antenna 104 an the capacitor 220 may be increased, as compared to a capacitance value of an inductive coupling system including just an antenna (as for example shown in FIG. 1A, FIG. 1B, FIG. 2A (top) and FIG. 2B (top). The higher capacitance value may allow a better power matching.

Alternatively or additionally, the capacitance may in various embodiments be kept similar, e.g. essentially the same as or only slightly higher than in the inductive coupling systems of FIG. 1A, FIG. 1B, FIG. 2A (top) and FIG. 2B (top). However, a fewer number of windings of the antenna 104 may be required for achieving the capacitance value. This is indicated in FIG. 2A (five windings in module 100*a* vs. three windings in module 200*a*) and in FIG. 2B (three windings in module 100*b* vs. two windings in module 200*b*). Thereby, room may be saved on the chip card module 200*a*, 200*b*, which may for example be used for decreasing a size of the chip card module 200*a*, 200*b*, and/or for increasing a size of a heat dissipation structure (in FIG. 1B, the heat dissipation structure is the metal plate 112; in the chip card module 200*a*, 200*b*, the heat dissipation structure may be formed by the first 2201 and/or the second 2202 electrode of the capacitor 220).

Figure 3B:
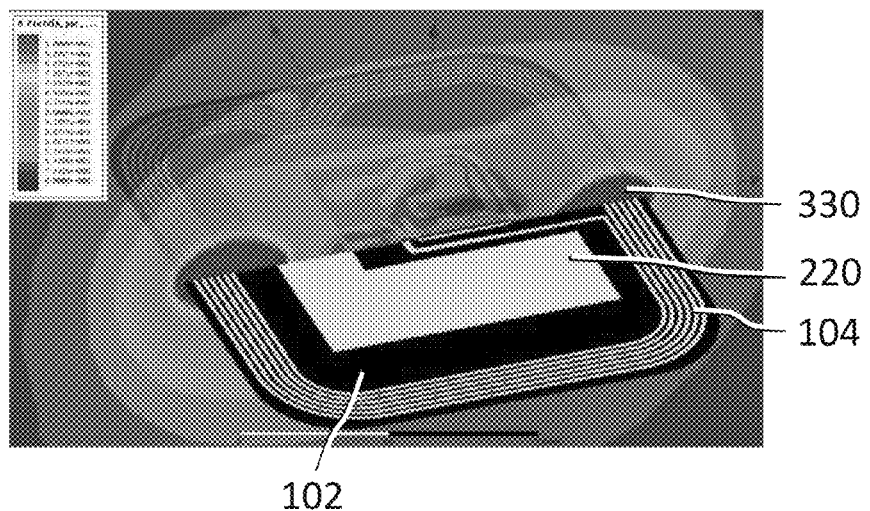

FIG. 3A and FIG. 3B each show a simulation of a magnetic field (as an H-field) of a CoM module 200*a* in accordance with various embodiments.

As shown in the top panel, the first electrode 2201 of the capacitor 220 may in various embodiments be directly connected (by structure 332) to the antenna 104 and to the chip contact structure 108.

As shown in the bottom panel, the structure 332 for directly connecting the first electrode 2201 of the capacitor 220 to the antenna 104 and to the chip contact structure 108 may in various embodiments not be present. Instead, the first electrode 2201 of the capacitor 220 may for example be connected to the chip 106 by the chip contact structure 108, and the chip contact structure 108 may further be electrically conductively connected to the antenna 104.

The second electrode 2202 may be electrically conductively connected to the chip 106 by plated through holes and by the chip contact structure 108.

In various embodiments, the first electrode 2201 and/or the second electrode 2202 may be thermally conductive and may be used for heat dissipation, for example of heat generated by the chip 106.

Decreasing an area on the carrier 102 required by the antenna 104 by electrically conductively coupling the capacitor 220 to the chip 106 may allow, in various embodiments, to increase a surface available for heat dissipation provided by the first electrode 2201 and/or the second electrode 2202, for example as compared to the metal plate 112 shown in FIG. 1B.

The chip card 600 may, in various embodiments, include a chip card body 660.

The chip card 700 may, in various embodiments, include a chip card body 660.

In various embodiments, the chip card 600 may further include a chip card module 200*a*, 200*b* in accordance with various embodiments as described above.

The chip card 600 may further, in various embodiments, include a second antenna 662, also referred to as booster antenna 662. The second antenna 662 may be formed on or in the chip card body 660 and may be inductively coupled to the antenna 104 of the chip card module 200*a*, 200*b*. The second antenna 662 may for example include a chip coupling region 664 that may be configured to inductively couple to the antenna 104 of the chip card module 200*a*, 200*b*. The chip coupling region may be formed around a chip module region, in which the chip module 200*a*, 200*b* may be arranged. The chip coupling region 664 of the second antenna 662 may, in various embodiments, encircle the chip card module 200*a*, 200*b*.

The chip card body 660 and the second antenna 662 may be formed as known in the art.

FIG. 7 shows process flow 700 of a method of forming a chip card module in accordance with various embodiments.

The method may include arranging a chip on a first side of a carrier (in 710), forming a first electrode of a capacitor over the carrier, such that the first electrode laterally at least partially surrounds the chip (in 720), forming a second electrode of the capacitor over a second side of the carrier opposite the first side of the carrier (in 730), arranging an antenna over the carrier (in 740), electrically conductively coupling the antenna to the chip, wherein the antenna is configured to inductively couple to a second antenna formed on the chip card (in 750), and electrically conductively coupling the capacitor to the chip (in 760).

In various embodiments, a chip card module for a chip card is provided. The chip card module may include a carrier with a first side and an opposite second side, a chip arranged over the first side of the carrier, an antenna arranged over the carrier, wherein the antenna may be electrically conductively coupled to the chip and configured to inductively couple to a second antenna formed on a chip card body of the chip card, and a capacitor electrically conductively coupled to the chip, the capacitor including a first electrode arranged over the first side of the carrier, and a second electrode arranged over the second side of the carrier.

In various embodiments, the antenna may be arranged on the first side of the carrier, wherein the first electrode may be located laterally between the chip and the antenna.

In various embodiments, the second electrode may be essentially opposite the first electrode.

In various embodiments, the chip card module may further include a plurality of chip contact pads arranged over the second side.

In various embodiments, the chip contact pads may at least partially laterally surround the second electrode.

In various embodiments, the capacitor may be electrically coupled to the chip in parallel to the chip contact pads.

In various embodiments, a chip card is provided. The chip card may include a chip card body, a second antenna formed on the chip card body, and a chip card module according to any of claims 1 to 6 arranged on the chip card body, wherein the antenna of the chip card module may be inductively coupled to the second antenna.

In various embodiments, a method of forming a chip card module for a chip card is provided. The method may include arranging a chip on a first side of a carrier, forming a first electrode of a capacitor over the carrier, such that the first electrode laterally at least partially surrounds the chip, forming a second electrode of the capacitor over a second side of the carrier opposite the first side of the carrier, arranging an antenna over the carrier, electrically conductively coupling the antenna to the chip, wherein the antenna is configured to inductively couple to a second antenna formed on the chip card, and electrically conductively coupling the capacitor to the chip.

In various embodiments, the method may further include forming a plurality of chip contact pads over the second side of the carrier.

In various embodiments, the forming a second electrode of the capacitor may be performed simultaneously with the forming the plurality of chip contact pads.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip card module for a chip card, comprising:
a carrier with a first side and an opposite second side;
a chip arranged over the first side of the carrier;
an antenna arranged over the carrier, wherein the antenna is electrically conductively coupled to the chip and configured to inductively couple to a second antenna formed on a chip card body of the chip card; and
a capacitor electrically conductively coupled to the chip, the capacitor comprising a first electrode arranged over the first side of the carrier, and a second electrode arranged over the second side of the carrier.

2. The chip card module according to claim 1, wherein the antenna is arranged on the first side of the carrier;
wherein the first electrode is located laterally between the chip and the antenna.

3. The chip card module according to claim 1, wherein the second electrode is essentially opposite the first electrode.

4. The chip card module according to claim 1, further comprising:
a plurality of chip contact pads arranged over the second side.

5. The chip card module according to claim 4, wherein the chip contact pads at least partially laterally surround the second electrode.

6. The chip card module according to claim 4, wherein the capacitor is electrically coupled to the chip in parallel to the chip contact pads.

7. The chip card module of claim 1, wherein the first electrode comprises a recess in which the chip is located.

8. The chip card module of claim 1, wherein first electrode is located on two or more sides of the chip.

9. The chip card module of claim 1, wherein the capacitor is integrated into the chip card module so that the carrier forms a dielectric of the capacitor between the first electrode and the second electrode.

10. A chip card, comprising:
a chip card body;
a second antenna formed on the chip card body; and
a chip card module arranged on the chip card body, the chip card module comprising:
a carrier with a first side and an opposite second side;
a chip arranged over the first side of the carrier;
an antenna arranged over the carrier, wherein the antenna is electrically conductively coupled to the chip and configured to inductively couple to the second antenna; and
a capacitor electrically conductively coupled to the chip, the capacitor comprising a first electrode arranged over the first side of the carrier, and a second electrode arranged over the second side of the carrier;
wherein the antenna of the chip card module is inductively coupled to the second antenna.

11. The chip card of claim 10,
wherein the antenna is arranged on the first side of the carrier;
wherein the first electrode is located laterally between the chip and the antenna.

12. The chip card of claim 10, wherein the first electrode comprises a recess in which the chip is located.

13. The chip card of claim 10, wherein first electrode is located on two or more sides of the chip.

14. The chip card of claim 10, wherein the capacitor is integrated into the chip card module so that the carrier forms a dielectric of the capacitor between the first electrode and the second electrode.

15. A method of forming a chip card module for a chip card, the method comprising:
arranging a chip on a first side of a carrier;
forming a first electrode of a capacitor over the carrier;
forming a second electrode of the capacitor over a second side of the carrier opposite the first side of the carrier;
arranging an antenna over the carrier;

electrically conductively coupling the antenna to the chip, wherein the antenna is configured to inductively couple to a second antenna formed on the chip card; and electrically conductively coupling the capacitor to the chip.

16. The method of claim 15, further comprising:

forming a plurality of chip contact pads over the second side of the carrier.

17. The method of claim 16, wherein the forming a second electrode of the capacitor is performed simultaneously with the forming the plurality of chip contact pads.

* * * * *